(12) United States Patent
Xu et al.

(10) Patent No.: US 8,533,136 B1
(45) Date of Patent: Sep. 10, 2013

(54) METHOD AND SYSTEM FOR GENERATING NONLINEAR SIMULATION MODEL

(75) Inventors: Jianjun Xu, Petaluma, CA (US); Jason M. Horn, Santa Rosa, CA (US); Masaya Iwamoto, Rohnert Park, CA (US); David E. Root, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 366 days.

(21) Appl. No.: 13/036,917

(22) Filed: Feb. 28, 2011

(51) Int. Cl.
 *G06N 5/00* (2006.01)
(52) U.S. Cl.
 USPC .............................................. 706/16; 706/45
(58) Field of Classification Search
 USPC ..................................................... 706/16, 45
 See application file for complete search history.

(56) References Cited

PUBLICATIONS

Xu, et al., Large-signal FET Model with Multiple Time Scale Dynamics from Nonlinear Vector Network Analyzer Data, IEEE MTTS Int Microw Symp, 2010, pp. 1-4.*
S.A. Albahrani et al., "Characterizing drain current dispersion in GaN HEMTs with a new trap model", Proceedings of the 4th European Microwave Integrated Circuits Conference, Sep. 2009 , pp. 339-342.
D. Gunyan et al., "Nonlinear validation of arbitrary load X-parameter and measurement-based device models", 2009 73rd ARFTG Microwave Measurement Conference, 2009 , pp. 1-4.
P.J. Tasker, "Practical waveform engineering", Microwave Magazine, IEEE, vol. 10 , Issue: 7, Dec. 2009, pp. 65-76.
Jianjun Xu et al. "Large-signal FET model with multiple time scale dynamics from nonlinear vector network analyzer data", 2010 IEEE MTT-S International Microwave Symposium Digest (MTT), 2010 , pp. 417-420.
Q J. Zhang et al., "Neural Networks for RF and Microwave Design: Training of Neural Networks", Norwood, MA, Artech House, 2000, p. 105-141.
Franz Sischka, "Improved Compact Models Based on Nonlinear Vector Network Analyzer (NVNA) Measurements", European Microwave Week CNIT Paris seminar, Sep. 25, 2010, pp. 1-16.
Jianjun Xu et al., "Exact Adjoint Sensitivity Analysis for Neural-Based Microwave Modeling and Design", IIEEE Transactions on Microwave Theory and Techniques, vol. 51, No. 1, Jan. 2003, pp. 226-237.
S.A. Albahrani et al., "Characterizing drain current dispersion in GaN HEMTs with a new trap model", Proceedings of the 4th European Microwave Integrated Circuits Conference, Sep. 2009, pp. 339-342.
A.M. Conway et al., "Virtual Gate Large Signal Model of GaN HFETs", IEEE/MTT-S International Microwave Symposium, 2007, pp. 605-608.
D. Gunyan et al., "Nonlinear validation of arbitrary load X-parameter and measurement-based device models", 2009 73rd ARFTG Microwave Measurement Conference, 2009, pp. 1-4.

(Continued)

*Primary Examiner* — Wilbert L Starks

(57) ABSTRACT

A method and system are provided for generating a nonlinear simulation model of a device under test (DUT). The method and system include receiving large-signal nonlinear waveform data based on responses of the DUT to input signals, determining a set of first dynamical variables and a set of second dynamical variables from the nonlinear waveform data, calculating values of second dynamical variables, providing nonlinear constitutive relations as functions of the first dynamical variables and the calculated values of the second dynamical variables, and compiling the nonlinear simulation model of the DUT using the identified nonlinear constitutive relations.

20 Claims, 6 Drawing Sheets

(56) References Cited

PUBLICATIONS

O. Jardel et al., "An Electrothermal Model for AlGaN/GaN Power HEMTs Including Trapping Effects to Improve Large-Signal Simulation Results on High VSWR", IEEE Transactions on Microwave Theory and Techniques, vol. 55, No. 12, Dec. 2007, pp. 2660-2669.

G. Simpson et al. "Load-pull + NVNA = enhanced X-parameters for PA designs with high mismatch and technology-independent large-signal device models", ARFTG Microwave Measurement Symposium, 2008 72nd, pp. 88-91.

P.J. Tasker, "Practical waveform engineering", Microwave Magazine, IEEE, vol. 10, Issue: 7, Dec. 2009, pp. 65-76.

Jianjun Xu et al. "Large-signal FET model with multiple time scale dynamics from nonlinear vector network analyzer data", 2010 IEEE MTT-S International Microwave Symposium Digest (MTT), 2010, pp. 417-420.

http://www.agilent.com/find/nvna.

Q. J. Zhang et al., "Neural Networks for RF and Microwave Design: Training of Neural Networks", Norwood, MA, Artech House, 2000, p. 105-141.

* cited by examiner

METHOD AND SYSTEM FOR GENERATING NONLINEAR SIMULATION MODEL

BACKGROUND

Nonlinear models of electronic components, such as transistors, for circuit simulation are important tools for design of nonlinear integrated circuits, monolithic microwave integrated circuits (MMICs), and the like. The nonlinear electronic component models represent performance characteristics of underlying device technology in mathematical form, which may be used together with other components in a circuit simulator to develop and optimize design. The trend towards increasing energy efficiency, e.g., to extend battery life of mobile wireless communication devices, requires transistors, in particular, to operate under conditions that are becoming more nonlinear. Also, the wider bandwidths of modern signal formats, such as long term evolution (LTE), WiMAX and wideband code division multiple access (WCDMA), are stimulating the transistors with complex modulation formats, including more complicated signals with higher peak-to-average ratios. Further, transistors fabricated in new semiconductor materials, such as gallium nitride (GaN), and other compound semiconductor materials, such as gallium arsenide (GaAs), may exhibit complicated nonlinear dynamical effects in response to the complex modulation signals. Consequently, powerful and sophisticated nonlinear simulation models are needed to accurately and robustly incorporate these various effects that impact performance characteristics of the nonlinear integrated circuits.

Conventional nonlinear electronic component models, which may be referred to as "compact" models, are generally implemented in circuit simulators as nonlinear, ordinary differential equations, or equivalently, nonlinear equivalent circuit elements arranged in a specific equivalent circuit topology. For a specific equivalent circuit topology, the nonlinear constitutive relations are typically fixed, closed-form expressions defining terminal currents as nonlinear functions of controlling variables, such as voltages.

Conventional data used in these models are typically obtained from a variety of disparate and often limited measurements. Conventional data include DC IV characteristics and linear S-parameters versus bias and frequency, sometimes obtained over a range of ambient temperatures. These types of conventional data generally are not sufficient to separate all dynamical effects from one another, such as dynamic self-heating and trapping phenomena. More recently, pulsed-bias measurements, and pulsed S-parameter data have been used to help gain insight into device performance and, to some degree, separate dynamical effects from one another. However, the timescales of the pulsed-bias measurements are typically limited to a range of 0.1 µs to 1.0 µs, which is much slower than the characteristic timescales of a radio frequency (RF) input signal, which may be in a range of 0.01 ns to 1.0 ns.

In addition, the available model nonlinear constitutive relations are not sufficiently complex or accurate. They generally do not take into account the detailed dependence on the multiple dynamical variables. The choice of functional form for the constitutive relations may be based on physics, for example, but the resulting expressions may be too simple to fit the detailed measured performance characteristics of the actual nonlinear electronic components. An alternative is to postulate empirical nonlinear constitutive relations with unknown coefficients, which are then "extracted" by an optimization procedure to fit the functions to appropriate data. For semiconductor devices, such as GaN and GaAs transistors, that exhibit complicated dynamical behavior, including self-heating and trap capture and emission, the detailed functional dependence on all the relevant dynamical variables (e.g., instantaneous terminal voltages, junction temperature, trap states associated with gate-lag and drain lag, etc.) associated with these effects is quite complicated. Specific simplifying assumptions about the coupling of the relevant dynamical variables are inevitably invoked to obtain a sufficiently simple set of nonlinear constitutive relations to define, for example, the current as a function of all the relevant variables. Such simplifying assumptions lead to a loss of generality and a significant loss of accuracy for the resulting model. Therefore, no matter what parameter values are extracted, the accuracy of the model may be limited due to the over-simplified a priori form of the underlying constitutive relations.

Recently, more advanced types of nonlinear stimulus-response data, called waveform data, are beginning to become available with the introduction of waveform measurement systems such as Nonlinear Vector Network Analyzers (NV-NAs) and Large-Signal Network Analyzers (LSNAs). However, the same overly simple a priori constitutive relations are typically used as optimization targets in the extraction procedure. In other words, there is no general, procedural approach to constructing the nonlinear constitutive relations for complicated dynamical models directly from the device data, conventional or modern waveform data.

SUMMARY

In a representative embodiment, a method is provided for generating a nonlinear simulation model of a device under test (DUT). The method includes receiving large-signal nonlinear waveform data based on responses of the DUT to input signals, determining a set of first dynamical variables and a set of second dynamical variables from the nonlinear waveform data, and calculating values of second dynamical variables. Nonlinear constitutive relations are provided as functions of the first dynamical variables and the calculated values of the second dynamical variables. The nonlinear simulation model of the DUT is compiled using the identified nonlinear constitutive relations.

In another representative embodiment, a method is provided for generating a nonlinear simulation model of a transistor. The method includes providing large-signal nonlinear waveform data of the transistor from a nonlinear vector network analyzer, identifying dependencies of a model current source and a model charge source on at least one instantaneous terminal voltage, temperature and at least one trap state of the transistor identified directly from the nonlinear waveform data, and representing the identified dependencies using corresponding artificial neural networks. The method further includes compiling a model including the represented dependencies for implementation into a nonlinear circuit simulator to generate the nonlinear simulation model of the transistor.

In another representative embodiment, a system for generating a nonlinear simulation model of a nonlinear electronic component includes a vector network analyzer, a tuner, a processing device and artificial neural networks. The vector network analyzer is configured to provide nonlinear waveform data of the electronic component. The tuner is configured to stimulate simultaneously input and output ports of the electronic component at multiple frequencies to generate responses of the electronic component for a range of stimulus signals. The processing device is configured to identify nonlinear constitutive relations of a model current source and a model charge source of the electronic component as functions of at least one instantaneous terminal voltage, temperature and at least one trap state of the electronic component based on the nonlinear waveform data. The artificial neural networks are configured to represent the identified nonlinear constitutive relations, the represented nonlinear constitutive relations being compiled for implementation into a nonlinear circuit simulator to generate the nonlinear simulation model of the electronic component.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features and/or components.

DETAILED DESCRIPTION

Figure 1:
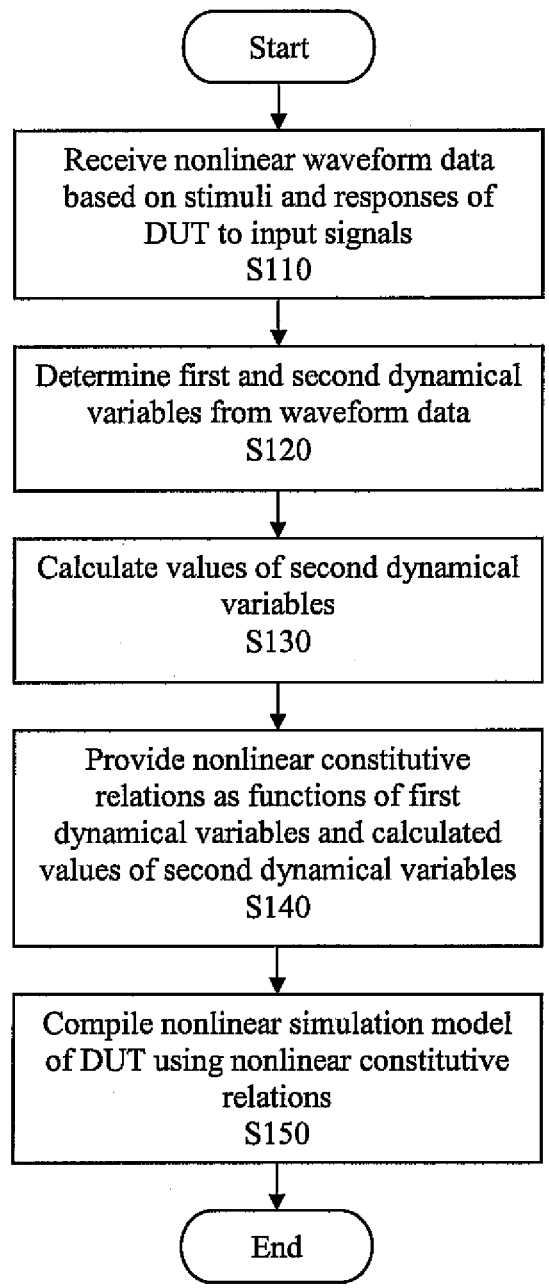
FIG. 1 is a flow diagram of a method for providing a nonlinear simulation model of a device under test (DUT) using nonlinear constitutive relations, according to a representative embodiment.

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments.

In view of this disclosure it is noted that the various nonlinear simulation models may be implemented in variant structures and using variant components in keeping with the present teachings. Further, the various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

According to various embodiments, detailed nonlinear constitutive relations may be explicitly determined for a sophisticated nonlinear simulation model of any of a variety of devices, including transistors and other electronic devices, for example. The nonlinear simulation model may include effects of dynamic self-heating, capture and emission of trapped charge carriers, and other linear and nonlinear responses of a device under test (DUT). Generally, stimulus-response nonlinear waveform data (e.g., measured or simulated) is provided by a vector network analyzer in conjunction with a load tuner and/or active load-pull system using an active source at input and output ports of the DUT, simultaneously. The simulated nonlinear waveform data, in particular, comes from a virtual version of otherwise measured values. Values of auxiliary dynamical variables, such as junction temperature and state variables associated with different species of trapped charges, for example, are determined from the nonlinear waveform data, e.g., based on dynamic trajectories derived from the nonlinear waveform data. A nonlinear simulation model identification process obtains the constitutive relations as functions of instantaneous (intrinsic) dynamical variables, e.g., such as terminal voltages, and the derived auxiliary dynamical variables.

In various embodiments, multi-variate artificial neural networks (ANNs) are trained to represent current and charge nonlinear constitutive relations based on the scattered set of independent dynamical variables, the performance of which would be apparent to one of ordinary skill in the art. An Adjoint training method may be used, for example, for the model charge functions, for example. Also, a procedure to implement the resulting model in the nonlinear simulator is developed. Generally, the Adjoint training method trains a function, such as $Q(x,y)$, from data related to the partial derivatives of Q with respect to each variable, such as $dQ/dx$ and $dQ/dy$. ANN training is therefore used to create an ANN for a model function corresponding directly to a measureable output (e.g., current), while Adjoint training is used to create an ANN for a model function (e.g., charge) having partial derivatives related to measurable outputs, such as capacitances.

FIG. 1 is a flowchart illustrating a method of providing a nonlinear simulation model of a DUT using nonlinear constitutive relations, according to a representative embodiment. For example, the method depicted in FIG. 1 may be used for providing a nonlinear simulation model of a transistor, such as a bipolar transistor or a field effect transistor (FET), including a GaN FET or a GaAs FET. However, it is understood that the method may be incorporated in modeling alternative types of nonlinear systems or components, including various electrical, mechanical and optical systems, as well as generic modeling, without departing from the scope of the present teachings.

The method may be implemented in whole or in part by one or more processing devices, such as processing device 440, described below with reference to FIG. 4. For example, the method may be implemented by one or more processors, application specific integrated circuits (ASICs), field-programmable gate arrays (FPGAs), or combinations thereof, using software, firmware, hard-wired logic circuits, or combinations thereof. When using a processor, a memory or other computer readable medium is included for storing executable software/firmware and/or executable code that allows it to perform the various functions.

Referring to FIG. 1, large-signal nonlinear waveform data is received based on stimulus signals and responses of DUT to the stimulus signals in memory in block S110. The responses may be measured responses provided by a network vector analyzer based on actual output signals from the DUT in response to the stimulus (input) signals. Alternatively, the responses may be simulated or virtual responses provided by the network vector analyzer based on output from a model of the DUT in response to the stimulus signals. In an embodiment, the vector network analyzer may be a PNA-X Series Nonlinear Vector Network Analyzer (NVNA), available from Agilent Technologies, Inc., for example, or other large-signal network analyzer. That is, a comprehensive characterization of the DUT may be accomplished using an automated NVNA together with synchronized bias supplies and a fundamental passive load tuner, such as tuner 430 discussed below with regard to FIG. 4. An active load, e.g., provided by another source controlled by the NVNA, may be substituted for the load tuner in alternative configurations. The nonlinear waveform data may be obtained by performing calibrated waveform measurements of the stimulus and response signals at different radio frequency (RF) powers, DC biases, ambient temperatures and load conditions, for example, provided by the load tuner or the active load-pull system at fundamental and harmonic frequencies. Alternatively, the nonlinear waveform data may be obtained using input tuning and harmonic tuning instead of or in addition to output load tuning.

In block S120, first and second dynamical variables are determined from the nonlinear waveform data obtained in block S110. In an embodiment, the first dynamical variables may include instantaneous terminal voltages of the DUT, such as input and output voltages for one or more input and output ports, respectively. For example, when the DUT is a FET, the instantaneous terminal voltages include a gate-source voltage $V_{gs}$ and a drain-source voltage $V_{ds}$, and when the DUT is a bipolar transistor, the instantaneous terminal voltages include a base-emitter voltage $V_{be}$ and a collector-emitter voltage $V_{ce}$. Also, in an embodiment, the second dynamical variables may include auxiliary variables, such as temperature and various state variables associated with operation of the DUT. For example, when the DUT is a FET, the auxiliary variables may include junction temperature $T_j$ and state variables associated with trap states, such as first trap state $\Phi_1$ associated with gate-lag and second trap state $\Phi_2$ associated with drain-lag of the FET. When the DUT is a bipolar transistor, the auxiliary variables may include the junction temperature $T_j$, and no state variables associated with trap states.

In an embodiment, an intrinsic model, time-dependent output current of a representative DUT may be postulated to be a sum of terms corresponding to current and charge sources. When the DUT is a FET, for example, the time-dependent output current, indicated as drain current $I_D$, is provided by Equation (1.1), below:

$$I_D(t) = I_D(V_{gs}(t), V_{ds}(t), T_j(t), \Phi_1(t), \Phi_2(t)) + \frac{d}{dt} Q_D(V_{gs}(t), V_{ds}(t), T_j(t), \Phi_1(t), \Phi_2(t)) \quad (1.1)$$

As stated above, the first dynamical variables include the gate-source voltage $V_{gs}$ and the drain-source voltage $V_{ds}$, and the second dynamical variables include the junction temperature $T_j$, the first trap state $\Phi_1$ associated with gate-lag and the second trap state $\Phi_2$ associated with drain-lag. The time derivative values of the second dynamical variables may be provided by Equations (1.2)-(1.4), below:

$$\dot{T} = \frac{T_0 - T(t)}{\tau_{th}} + \frac{1}{C_{th}} \langle I(t) V(t) \rangle \quad (1.2)$$

$$\dot{\Phi}_1 = f_1(V_{gs}(t) - \Phi_1(t)) + \frac{V_{gs}(t) - \Phi_1(t)}{\tau_{1\_emit}} \quad (1.3)$$

$$\dot{\Phi}_2 = f_2(V_{ds}(t) - \Phi_2(t)) + \frac{V_{ds}(t) - \Phi_2(t)}{\tau_{2\_emit}} \quad (1.4)$$

In equations (1.3) and (1.4), $f_1$ and $f_2$ are functions representing capture processes, e.g., which may be similar to the capture processes proposed by Jardel et al., IEEE TRANS. MTT., vol. 55, pp. 2660-2669 (2007), the contents of which is hereby incorporated by reference, and $\tau_{emit\_1}$ and $\tau_{emit\_2}$ are emission time constants. For example, functions $f_1$ and $f_2$ may represent the preferential fast capture rates, when the instantaneous gate-source voltage $V_{gs}$ becomes less than the instantaneous trap state voltage for gate-lag, and when the instantaneous drain-source $V_{ds}$ voltage becomes greater than the instantaneous trap state voltage for drain-lag, respectively. In equation (1.2), $T_0$ is the ambient or case temperature, $\tau_{th}$ is the thermal time constant, $C_{th}$ is the thermal capacitance, and $<>$ is the time average. A higher order differential equation may be used in place of Equation (1.2) to better approximate the thermal diffusion partial differential equation, as would be apparent to one of ordinary skill in the art. Alternatively a linear transfer function for the thermal response with a sub-first-order dependence may be used.

The time-dependent input current, indicated as gate current $I_G$, does not include the effects of the trap states, as provided by Equation (1.5), below:

$$I_G(t) = I_G(V_{gs}(t), V_{ds}(t), T_j(t)) + \frac{d}{dt} Q_D(V_{gs}(t), V_{ds}(t), T_j(t)) \quad (1.5)$$

Of course, the number and type of first and second dynamical variables may vary with regard to the DUT and the desired information, without departing from the scope of the present teachings. For example, the DUT may be a device having more than two ports, thus requiring measurement or simulation of additional instantaneous terminal voltages as first dynamical variables.

Figure 2:
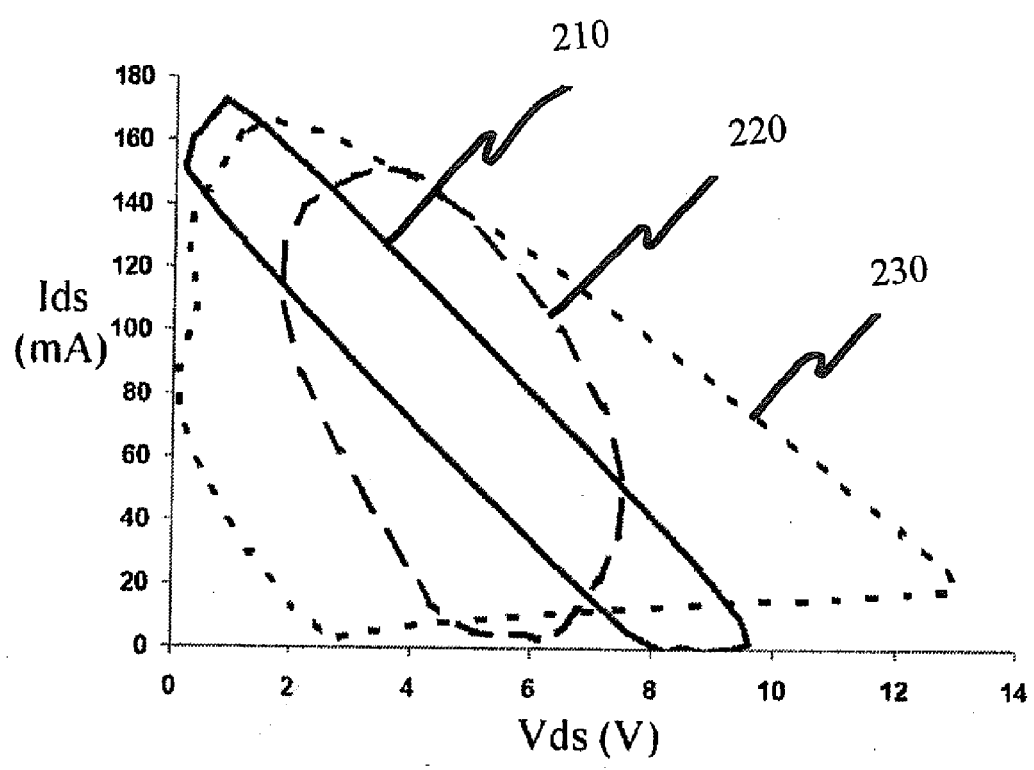
FIG. 2 is a graph showing samples of illustrative measured dynamic trajectories derived from nonlinear waveform data, according to a representative embodiment.

Referring again to FIG. 1, values for the second dynamical variables are calculated in block S130. In an embodiment, the calculated values are steady state values, which may be indicative of the average values of the second dynamical variables from the nonlinear waveform data corresponding to the steady state operating point of the stimulus signal, for example. In an embodiment, steady state values may be calculated based on corresponding RF dynamic trajectories, for example, as shown in FIG. 2, discussed below. Alternatively, the steady state values may be time varying, or the calculated values may not be steady state values.

In block S140, nonlinear constitutive relations are provided as functions of the first dynamical variables and the calculated values of the second dynamical variables. For example, when the DUT is a FET, providing the nonlinear constitutive relations may include identifying respective nonlinear constitutive relations of a model current source (e.g., drain current $I_D$) and a model output charge source (e.g., output charge $Q_D$) of the FET as respective functions of the first dynamical variables and the calculated values of the second dynamical variables. In an embodiment, artificial neural networks (ANNs) are then trained to learn the identified nonlinear constitutive relations of the current source and the charge source, e.g., which may be similar to the training processes proposed by Zhang et al., *Neural Networks for RF and Microwave Design*, Norwood, Mass.: Artech House (2000), and/or Xu et al., *Exact Adjoint Sensitivity Analysis for Neural-Based Microwave Modeling and Design*, IEEE TRANSACTIONS ON MICROWAVE THEORY AND TECHNIQUES, Vol. 51, No. 1 (January 2003), pp. 226-237, the contents of which are hereby incorporated by reference. The nonlinear constitutive relations define relationships between each of the current sources and the charge sources and the independent values of the first and second dynamical variables. In other words, the nonlinear constitutive relations identify dependencies of the current source and the charge source on the first and second dynamical variables.

Generally, training the ANNs may include defining neural network internal parameters corresponding to the nonlinear constitutive relations of the current source and the charge source, respectively, and adjusting the neural network internal parameters to minimize an error function. For example, the error function may include a weighted sum of a time domain error function and a frequency domain error function corresponding to the waveforms of the nonlinear waveform data, as discussed below. Alternatively, the identified nonlinear constitutive relations of the current source and the charge source may be represented in various other forms, such as polynomials, without departing from the scope of the present teachings.

A nonlinear simulation model of the DUT is then compiled in block S150 using the nonlinear constitutive relations provided in block S140. For example, predetermined differential equations representing the nonlinear simulation model may be compiled with the nonlinear constitutive relations that are plugged into the differential equations for implementation into a nonlinear circuit simulator to generate the nonlinear large signal DUT model. Various differential equations may be applied to represent the nonlinear simulation model, as would be apparent to one of ordinary skill in the art, depending on the type of DUT being modeled and the unique criteria and/or circumstances of the simulation. For example, a higher order differential equation may be used to better describe the thermal diffusion process, and other differential equations may be used to describe other kinds of trapping phenomena, e.g., depending on the semiconductor.

An example of the method depicted in FIG. 1 is discussed below, where the objective of the training procedure of the ANNs is to identify the model functions of drain current $I_D$ and output charge $Q_D$ from the large-signal nonlinear waveform data. In the example, a vector signal analyzer, such as an NVNA, captures large-signal waveforms calibrated to the device planes and performs measurements at multiple power levels, e.g., from small-signal to over 8 dB compression, at fundamental frequencies of 2 GHz and 4 GHz, at a variety of loads. FIG. 2 is a graph showing samples of illustrative measured dynamic trajectories derived from the nonlinear waveform data. To obtain the plots of FIG. 2, the 26.5 GHz NVNA provided independent excitations with sinusoidal signals at 2 GHz and 4 GHz, and the large-signal waveforms were constructed from six complex harmonics (+DC) per measurement at the corresponding fundamental frequencies. In particular, FIG. 2 includes three dynamic trajectories, including dynamic trajectory 210, where the magnitude of the complex impedance $\Gamma$ is 0.1 at an angle of −87°, input RF power $P_{in}$ is 8 dbm, fundamental frequency is 2 GHz, bias is [−0.2, 5], and ambient temperature $T_0$ of 25° C.; dynamic trajectory 220, where the magnitude of the complex impedance $\Gamma$ is 0.6 at an angle of −125°, input RF power $P_{in}$ is −3 dbm, fundamental frequency is 4 GHz, bias is [−0.2, 5], and ambient temperature $T_0$ of 25° C.; and dynamic trajectory 230, where the magnitude of the complex impedance $\Gamma$ is 0.6 at an angle of −56°, input RF power $P_{in}$ is 6 dbm, fundamental frequency is 4 GHz, bias is [−0.2, 5], and ambient temperature $T_0$ of 25° C.

At these high frequencies, for fixed power and load, the second dynamical variables (e.g., junction temperature $T_j$, first trap state $\Phi_1$ and second trap state $\Phi_2$) take on constant values indicative of their average over the RF trajectory corresponding to the large-signal steady state operating point, as shown in FIG. 2, as discussed above. Therefore, at steady state, Equation (1.1) provides measured drain current $I_D^{meas}$ as indicated by Equation (1.6), below:

$$I_D^{meas}(t) = I_D(V_{gs}(t), V_{ds}(t), T_j(\lambda), \Phi_1(\lambda), \Phi_2(\lambda)) + \frac{d}{dt}Q_D(V_{gs}(t), V_{ds}(t), T_j(\lambda), \Phi_1(\lambda), \Phi_2(\lambda)) \quad (1.6)$$

In Equation (1.6), $\lambda = [P_{in}, f, Z_{out}, T_0]$, and defines the large-signal steady state experimental conditions with $T_0$ the ambient or case temperature, $P_{in}$ the input RF power, $Z_{out}$ the complex load impedance, and f the frequency of the large amplitude single-tone input signal incident into the gate of the FET. Thus, for each large-signal waveform, the corresponding steady state values of the second dynamical variables in Equation (1.6) may be calculated according to Equations (1.7)-(1.9), below:

$$T_j = T_0 + <I(t)V(t)> \cdot R_{th} \quad (1.7)$$

$$\Phi_1 = \text{Min}(V_{gs}(t)) \quad (1.8)$$

$$\Phi_2 = \text{Max}(V_{ds}(t)) \quad (1.9)$$

In equations (1.8) and (1.9), Min and Max are the minimum and maximum taken over all points on the periodic measured large-signal waveform, respectively. In Equation (1.7), I(t) is the time-dependent current waveform and V(t) is the time-dependent voltage waveform from the nonlinear waveform data, and $R_{th}$ is the thermal resistance that needs to be independently extracted.

Equations (1.7), (1.8) and (1.9) define particular values for each measured steady state waveform. The consistency of Equations (1.7), (1.8) and (1.9) with Equations (1.2), (1.3) and (1.4), respectively, depends on the fact that typical thermal and trap emission time constants can be considered long compared with the fundamental RF excitation frequency, and the form of the functions $\theta_1$ and $\theta_2$ in Equations (1.3) and (1.4) are such that capture processes are faster than the RF signal, e.g., whenever the instantaneous gate-source voltage $V_{gs}$ becomes less than the instantaneous trap state voltage for gate-lag, and when the instantaneous drain-source $V_{ds}$ voltage becomes greater than the instantaneous trap state voltage for drain-lag, respectively.

In the present example, ANNs are trained to learn the functions of the drain current $I_D$ ($I_{D\_ANN}$) and the output charge $Q_D$ ($Q_{D\_ANN}$) given the set of first dynamical variables $V_{gs}(t)$ and $V_{ds}(t)$, and the steady state or fixed values of the set of second dynamical variables junction temperature $T_j$, first trap state $\Phi_1$ and second trap state $\Phi_2$ from Equations (1.7), (1.8) and (1.9), respectively, corresponding to each dynamic trajectory. The ANNs $I_{D\_ANN}$ and $Q_{D\_ANN}$ depend on neural network internal parameters, which may be defined as $w_{ID}$ and $w_{QD}$, respectively. The neural network internal parameters $w_{ID}$ and $w_{QD}$ are determined, for example, by standard ANN training and/or Adjoint training algorithms, discussed above, minimizing the error between model-generated responses and measured (or simulated) responses over the ensemble of measured waveform data, DC and linear measurements on the DUT. Thus, the training objective is to adjust the neural network internal parameters $w_{ID}$ and $w_{QD}$ to minimize an error function E, as indicated by Equation (2.0), below:

$$E = \sum_{k=1}^{no.\ of\ waveforms} (W_1 \cdot E_{k,1} + W_2 \cdot E_{k,2}) \quad (2.0)$$

In Equation (2.0), $E_{k,1}$ is the time domain error function and $E_{k,2}$ is the frequency domain error function for the $k^{th}$ waveform, respectively, which are provided by Equations (2.1) and (2.2), below:

$$E_{k,1} = \sum_{m=1}^{no.\ of\ timepoints} |I_D(m) - I_D^{meas}(m)|^2 \quad (2.1)$$

$$E_{k,2} = \sum_{n=0}^{no.\ of\ harmonics} |I_{D\_spectrum}(n) - I_{D\_spectrum}^{meas}(n)|^2 \quad (2.2)$$

Referring to Equations (2.0), (2.1) and (2.2), $W_1$ and $W_2$ are the weighting parameters used to balance the time domain and frequency domain error functions $E_{k,1}$ and $E_{k,2}$. $I_{D\_spectrum}$ and $I_{D\_spectrum}^{meas}$ are the spectra of drain current $I_D$ and measured drain current $I_D^{meas}$ respectively. Each function, drain current $I_D$ and output charge $Q_D$ in Equation (1.6) is represented by a nested set of transcendental functions, the specifics of which are described by the structure of the ANNs (e.g., one or two layers, 10 or 15 neurons per layer) and the form for the processing function associated with each neuron. The neural network internal parameters $w_{ID}$ and $w_{QD}$ are the "coefficients" of the neural network whose numerical values are obtained during the training process, as would be apparent to one having ordinary skill in the art.

Figure 3:
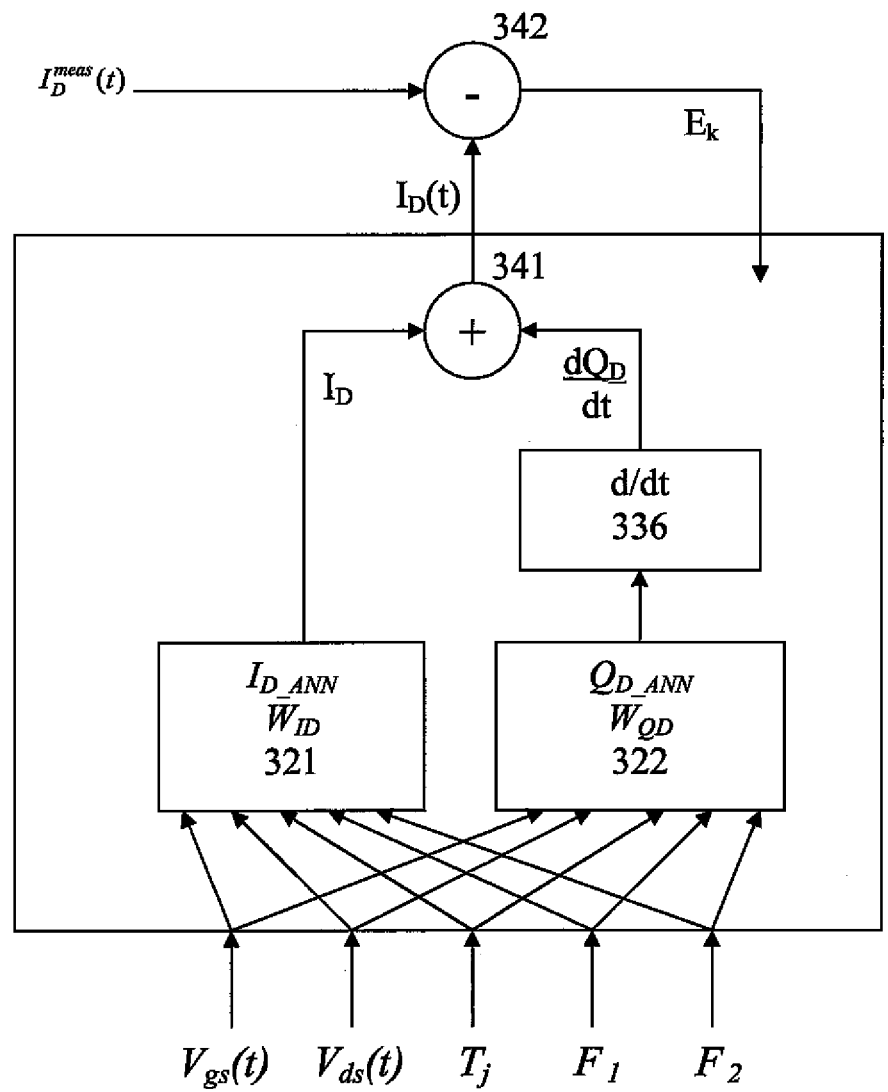
FIG. 3 depicts a training diagram for learning current and charge functions, according to a representative embodiment.

FIG. 3 depicts a training diagram for leaning drain current and output charge functions, according to a representative embodiment.

Referring to FIG. 3, ANN $I_{D\_ANN}$ in block 321 produces model functions of the drain current $I_D$, and ANN $Q_{D\_ANN}$ in block 322 produces model functions of the output charge $Q_D$. The model functions are evaluated at corresponding time-varying arguments of the first and second dynamical variables, e.g., gate-source voltage $V_{gs}(t)$ and drain-source voltage $V_{ds}(t)$, and junction temperature $T_j$, first trap state $\Phi_1$ and second trap state $\Phi_2$, according to Equations (1.2), (1.3) and (1.4), respectively. The time-derivative of the output charge $Q_D$ model function is performed in block 336. Then, the time-dependent drain current $I_D(t)$ of the representative FET is determined as the sum of the drain current $I_D$ model function and the derivative of the output charge $Q_D$ model function in block 341. The error function $E_k$ is determined in block 342 by comparing the time-dependent drain current $I_D(t)$ with the measured (or simulated) time-dependent drain current $I_D^{meas}$. The error function $E_k$ provides feedback for adjusting the neural network internal parameters $w_{ID}$ and $w_{QD}$ of ANN $I_{D\_ANN}$ and ANN $Q_{D\_ANN}$, respectively, in order to progressively minimize the error function $E_k$.

The nonlinear simulation model identified and implemented according to various embodiments is a time-domain model of a "compact" type, suitable for conventional nonlinear simulators in all modes of simulation (e.g. transient analysis, harmonic balance, and circuit envelope). This is in contrast to X-parameter models, which may also be identified from large-signal nonlinear waveform data, which constitute a complementary approach to DUT modeling in the frequency and envelope domains.

Figure 4:
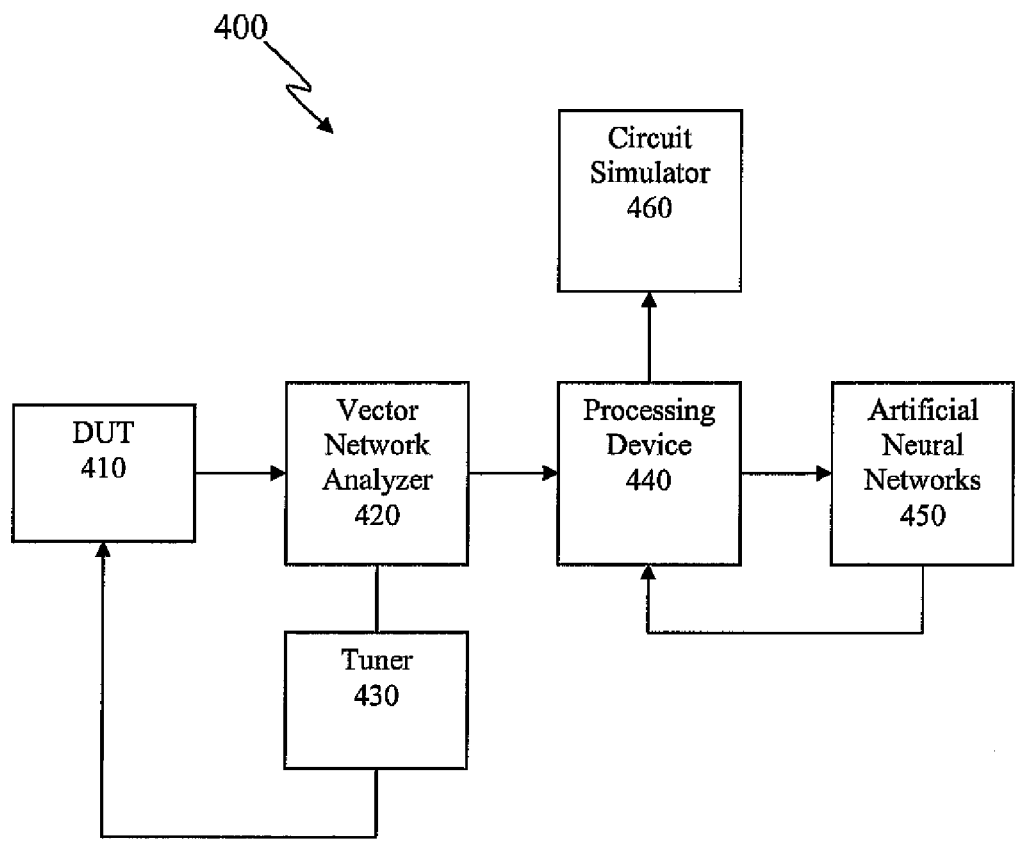
FIG. 4 is a simplified block diagram of a system for providing a nonlinear simulation model of DUT using nonlinear constitutive relations, according to a representative embodiment.

FIG. 4 is a simplified block diagram of a system for providing a nonlinear simulation model of DUT using nonlinear constitutive relations, according to a representative embodiment.

Referring to FIG. 4, modeling system 400 provides a nonlinear simulation model of DUT 410, which may be any component having a nonlinear response to stimulus signals. For purposes of discussion, it is assumed that the DUT 410 is transistor, such as a GaN FET or a GaAs FET, although this example is not limiting. The modeling system 400 includes vector network analyzer 420 and tuner 430, which provide load dependent stimulus signals to the DUT 410. More particularly, the stimulus signals vary in RF power, DC bias, ambient temperature and load conditions, for example, and the vector network analyzer 420 obtains the large-signal nonlinear waveform data by performing calibrated waveform measurements of the responses of the DUT 410 to the stimulus signals. The different load conditions may be provided by the tuner 430 or alternatively an active load-pull system (not shown) at fundamental and harmonic frequencies. In various configurations, the tuner 430 may consist of a set of load tuners or source tuners. For example, the tuner 430 may be configured to stimulate simultaneously input and output ports of the DUT 410 at multiple frequencies, using signals reflected or injected into the input and output ports. The vector network analyzer 420 may measure the stimulus and response signals simultaneously, so that the response of the DUT 410 is obtained over the full range of stimulus signals. A load-pull/source-pull system alternatively uses either a tuner, which reflects energy back into a port of the DUT 410, or an additional source to separately inject energy into one of the output port or the input port of the DUT 410.

Of course, in alternative embodiments, the DUT 410 may not be the actual component, but rather may be software executable by a computer processor for simulating outputs of the DUT 410 in response to stimulus signals. The vector network analyzer 420 may be an NVNA, available from Agilent Technologies, Inc., as mentioned above, although other types of devices capable of generating large-signals and/or collecting nonlinear waveform data, such as large-signal network analyzers and oscilloscopes, may be incorporated without departing from the scope of the present teachings.

The nonlinear waveform data is provided by the vector network analyzer 420 to the processing device 440. The processing device 440 determines first and second dynamical variables from the nonlinear waveform data, and calculates values of the second dynamical variables (e.g., steady state values), as discussed above with reference to blocks S120 and S130 of FIG. 1. Generally, the processing device 440 is configured to execute one or more logical or mathematical algorithms, including the modeling processes of the embodiments described herein (e.g., including the various steps of FIG. 1). The processing device 440 may be constructed of any combination of hardware, firmware or software architectures, and include its own memory (e.g., nonvolatile memory) for storing executable software/firmware executable code that allows it to perform the various functions. Alternatively, the executable code may be stored in designated memory locations within external memory (not shown). In an embodiment, the processing device 440 may be a central processing unit (CPU), for example, executing an operating system, which may also control execution of other programs of the modeling system 400. The internal and/or external memory may be any number, type and combination of nonvolatile read only memory (ROM) and volatile random access memory (RAM), and store various types of information, such as computer programs and software algorithms executable by the processing device 440 (and/or other components, such as the artificial neural networks 450 and the circuit simulator 460), e.g., for the simulation processes of the embodiments described herein. The memories may include any number, type and combination of tangible computer readable storage media, such as a disk drive, an electrically programmable read-only memory (EPROM), an electrically erasable and programmable read only memory (EEPROM), a CD, a DVD, a universal serial bus (USB) drive, and the like.

The processing device 440 provides the first dynamical variables and the calculated values of the second dynamical variables to the artificial neural networks 450. The artificial neural networks 450 are nonlinear computational models, implemented by computer software, used to model the dependencies or nonlinear constitutive relations of variables of DUT 410 operation (e.g., model current source and model charge source of the FET) with the first dynamical variables and the calculated values of the second dynamical variables, as discussed above with reference to block S140 of FIG. 1. The artificial neural networks 450 may be predetermined up to the numerical value of the weights that are obtained during the training process. Although depicted separately, the functionality of the artificial neural networks 450 may be implemented by the processing device 440, in various embodiments.

The nonlinear constitutive relations are output to the processing device 440, which compiles the constitutive relations, along with the simulation model, and provides the compiled information to the circuit simulator 460. The various techniques for structuring the simulation model, and for compiling the constitutive relations and the simulation model, are apparent to one of ordinary skill in the art, and thus further description is not provided herein. The circuit simulator 460 may be implemented by computer software, and is used to model the relationships between the input and output of the DUT 410. Again, although depicted separately, the functionality of the circuit simulator 460 may be implemented by the processing device 440, in various embodiments. Alternatively, the circuit simulator 460 may be any or all the simulators available in Agilent Technologies Advanced Design System (ADS), for example.

Figure 5A:
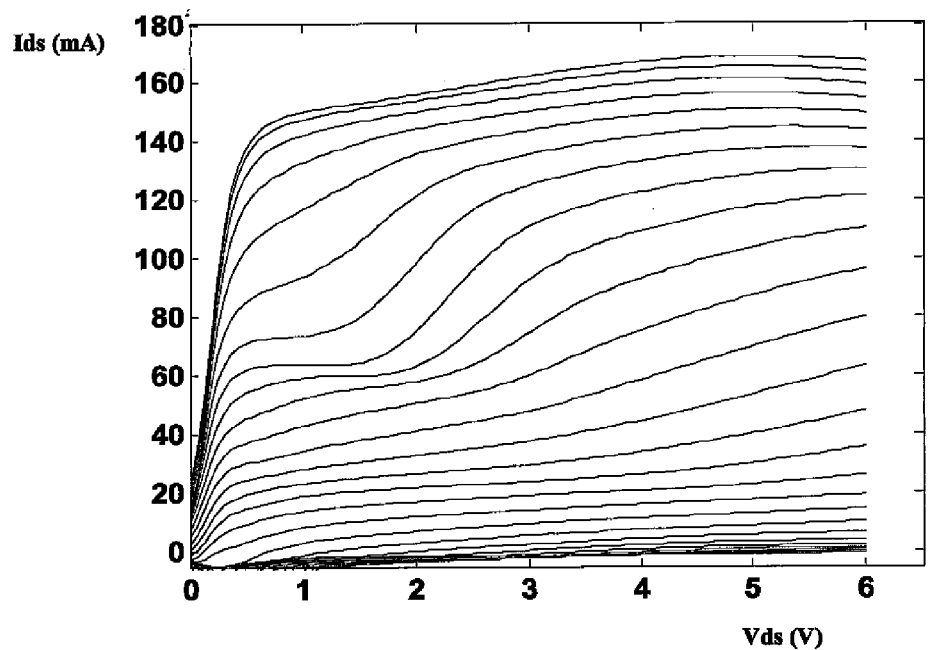
FIGS. 5A and 5B are plots showing model function results for different values of second dynamical variables, according to a representative embodiment.
Figure 5B:
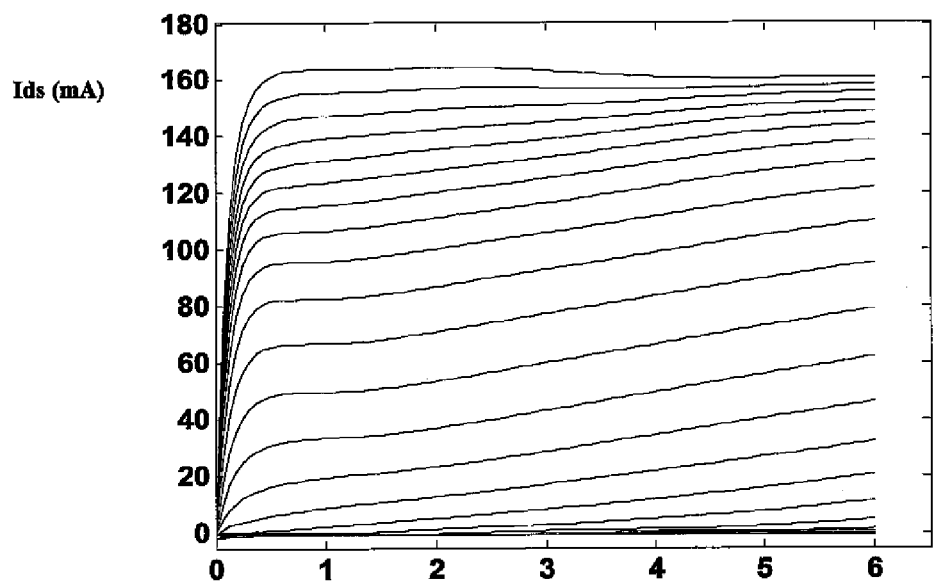
Figure 6:
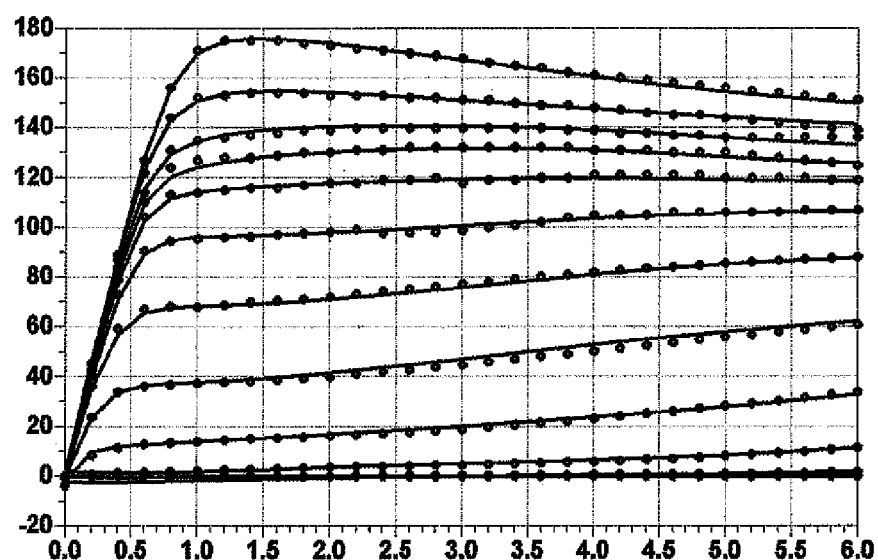
FIG. 6 shows plots comparing measured DC curves with modeled DC curves, according to a representative embodiment.

FIGS. 5A and 5B are plots showing model function results for different values of second dynamical variables, according to a representative embodiment. FIG. 6 shows plots comparing measured DC curves with modeled DC curves, according to a representative embodiment.

The model function results were obtained using a 300 μm total gate-width GaAs pseudomorphic high electron mobility transistor (pHEMT) for 50 GHz broadband circuit applications as the DUT 410. Due to the wide gate recess (to achieve high breakdown and power), the DUT 410 is suitable to test a model with dynamic effects, such as trapping (both gate and drain lags), as well as dynamic self-heating.

FIGS. 5A and 5B show results of the drain current $I_D$ model function for two different sets of values of the trap states, respectively, and a fixed junction temperature $T_j$ of 65° C. More particularly, the first trap state $\Phi_1$ is −2.0 and the second trap state $\Phi_2$ is 8.0 in FIG. 5A, and the first trap state $\Phi_1$ and the second trap state $\Phi_2$ correspond to the DC operating points in FIG. 5B. The model drain current intrinsic isothermal characteristics were recovered along a submanifold, where the first trap state $\Phi_1$ equaled the gate-source voltage $V_{gs}$ and the second trap state $\Phi_2$ equaled the drain-source voltage $V_{ds}$ in the drain current $I_D$ model function, i.e., $I_D(V_{gs}, V_{ds}, T_j, \Phi_1=V_{gs}, \Phi_2=V_{ds})$. FIG. 5A shows a "knee walk-out" effect as compared to the isothermal static model predictions shown in FIG. 5B.

FIG. 6 shows the comparison of the modeled DC curves (solid lines) and measured DC curves (points) further to a validation test. As shown, there is excellent agreement between the modeled and measured DC curves.

Generally, the nonlinear simulation model incorporates frequency dispersion, accurately accounts for distortion effects from small-signal conditions to very large levels of compression at both low and high frequencies, and accounts for "knee walkout," frequency dependent power saturation and other large-signal dynamical effects common to GaAs and GaN FETs.

Thus, various embodiments create nonlinear simulation models for a wide range of electronic devices, such as transistors in different semiconductor technologies, which are simultaneously more general and more accurate than conventional nonlinear simulation models. Usually generality and accuracy are mutually inconsistent features. Also, device-specific nonlinear simulation models may be created directly from stimulus-response nonlinear waveform data, including measured waveform data on an NVNA, vector network analyzer or equivalent instrument. The time-consuming and human expert intensive work needed to develop explicit model equations (constitutive relations) defining the specific relationship between observed responses and the controlling dynamical variables may be eliminated, as the explicit model equations discussed herein, in many variables, are generated automatically, as part of the process. Also, the various embodiments eliminate conventional "parameter extraction" to fixed equations, and replace it with "model generation," constructing the explicit model equations themselves.

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

The invention claimed is:

1. A method of generating a nonlinear simulation model of a device under test (DUT), the method comprising:

receiving large-signal nonlinear waveform data based on responses of the DUT to input signals;

determining a set of first dynamical variables and a set of second dynamical variables from the nonlinear waveform data;

calculating values of second dynamical variables;

providing nonlinear constitutive relations as functions of the first dynamical variables and the calculated values of the second dynamical variables; and compiling the nonlinear simulation model of the DUT using the identified nonlinear constitutive relations.

2. The method of claim 1, wherein the responses of the DUT comprise measured responses from the DUT or simulated responses from a model of the DUT.

3. The method of claim 1, wherein providing the nonlinear constitutive relations comprises:

identifying respective nonlinear constitutive relations of a current source and a charge source of the DUT as respective functions of the first dynamical variables and the calculated values of the second dynamical variables; and training artificial neural networks (ANNs) to learn the identified nonlinear constitutive relations of the current source and the charge source.

4. The method of claim 3, wherein training the ANNs to learn the identified nonlinear constitutive relations of the current source and the charge source comprises:
  defining neural network internal parameters corresponding to the nonlinear constitutive relations of the current source and the charge source, respectively; and
  adjusting the neural network internal parameters to minimize an error function.

5. The method of claim 4, wherein the error function comprises a weighted sum of a time domain error function and a frequency domain error function corresponding to the waveforms of the nonlinear waveform data.

6. The method of claim 3, wherein the nonlinear constitutive relations comprise nonlinear computational models modeling relationships between each of the current source and the charge source and the responses of the nonlinear waveform data.

7. The method of claim 1, wherein the first dynamical variables comprise instantaneous terminal voltages of the DUT, and the second dynamical variables comprise auxiliary variables.

8. The method of claim 7, wherein the instantaneous terminal voltages comprise at least one input voltage and at least one output voltage of the DUT, and the auxiliary variables comprise junction temperature and a plurality of state variables of the DUT.

9. The method of claim 8, wherein the at least one input voltage comprises a gate-source voltage ($V_{gs}$) and the at least one output voltage comprises a drain-source voltage ($V_{ds}$), and the plurality of state variables comprise state variables associated with different trapped charges of the DUT.

10. The method of claim 8, wherein the at least one input voltage comprises a base-emitter voltage ($V_{be}$) and the at least one output voltage comprises a collector-emitter voltage ($V_{ce}$).

11. The method of claim 1, wherein the nonlinear waveform data is received from a nonlinear vector network analyzer (NVNA).

12. A method of generating a nonlinear simulation model of a transistor, the method comprising:
  providing large-signal nonlinear waveform data of the transistor from a nonlinear vector network analyzer;
  identifying dependencies of a model current source and a model charge source on at least one instantaneous terminal voltage, temperature and at least one trap state of the transistor identified directly from the nonlinear waveform data;
  representing the identified dependencies using corresponding artificial neural networks; and
  compiling a model comprising the represented dependencies for implementation into a nonlinear circuit simulator to generate the nonlinear simulation model of the transistor.

13. The method of claim 12, wherein the at least one instantaneous terminal voltage comprises instantaneous gate-source voltage ($V_{gs}$) and instantaneous drain-source voltage ($V_{ds}$) of the transistor.

14. The method of claim 13, wherein the temperature comprises a dynamic junction temperature ($T_j$) of the transistor.

15. The method of claim 14, wherein identifying the dependencies of the model current source and the model charge source comprises:
  determining at least one instantaneous terminal voltage of the transistor based on the nonlinear waveform data; and
  calculating steady state values of the temperature and the at least one trap state of the transistor based on the nonlinear waveform data.

16. The method of claim 15, wherein representing the identified dependencies using the corresponding artificial neural networks comprises:
  training the artificial neural networks to learn the identified dependencies using the determined at least one instantaneous terminal voltage and the calculated steady state values of the temperature and the at least one trap state of the FET for each of the dynamic trajectories.

17. The method of claim 13, wherein the at least one trap state comprises a gate-lag trap state associated with a gate-lag of the transistor, and a drain-lag trap state associated with a drain-lag of the transistor.

18. The method of claim 12, wherein providing the nonlinear waveform data of the transistor comprises:
  performing calibrated waveform measurements of input signals at different radio frequency (RF) powers, DC biases, ambient temperatures and load conditions.

19. The method of claim 18, wherein the different load conditions are provided by a load tuner or an active load-pull system.

20. A system for generating a nonlinear simulation model of a nonlinear electronic component, the system comprising:
  a vector network analyzer configured to provide nonlinear waveform data of the electronic component;
  a tuner configured to stimulate simultaneously input and output ports of the electronic component at multiple frequencies to generate responses of the electronic component for a range of stimulus signals;
  a processing device configured to identify nonlinear constitutive relations of a model current source and a model charge source of the electronic component as functions of at least one instantaneous terminal voltage, temperature and at least one trap state of the electronic component based on the nonlinear waveform data; and
  artificial neural networks configured to represent the identified nonlinear constitutive relations, the represented nonlinear constitutive relations being compiled for implementation into a nonlinear circuit simulator to generate the nonlinear simulation model of the electronic component.

* * * * *